United States Patent
Ro et al.

[11] Patent Number: 6,033,972
[45] Date of Patent: Mar. 7, 2000

[54] GROWING METHOD OF GAAS QUANTUM DOTS USING CHEMICAL BEAM EPITAXY

[75] Inventors: Jeong Rae Ro; Sung Bock Kim; El Hang Lee, all of Daejeon, Rep. of Korea

[73] Assignee: Electronics and Telecommunications Research Institute, Daejeon, Rep. of Korea

[21] Appl. No.: 09/135,124

[22] Filed: Aug. 17, 1998

[30] Foreign Application Priority Data

Nov. 15, 1997 [KR] Rep. of Korea ................. 97-62773

[51] Int. Cl.[7] .................................................. H01L 21/208
[52] U.S. Cl. ........................... 438/507; 438/46; 438/962
[58] Field of Search ......................... 438/22, 46, 507, 438/509, 962; 257/14, 201, 615; 372/43

[56] References Cited

U.S. PATENT DOCUMENTS

| | | | |
|---|---|---|---|
| 5,229,320 | 7/1993 | Ugajin | 437/107 |
| 5,281,543 | 1/1994 | Fukuzawa et al. | |
| 5,482,890 | 1/1996 | Liu et al. | 437/107 |
| 5,543,354 | 8/1996 | Richard et al. | 437/129 |
| 5,614,435 | 3/1997 | Petroff et al. | 437/110 |

OTHER PUBLICATIONS

Lee et al., "Chemical beam epitaxial growth of InGaAs quantum dots using the droplet rechnique"; Ungyong Mulli, vol. 10, No. 3, p. 235–240, May 1997.

D.S.L. Mui et al., "Surface Migration Induced self–aligned InAs islands grown by molecular beam epitaxy", pp. 1620–1622. Applied Physics Letters 66 (13) Mar. 95.

M. Kitamura et al., "In situ fabrication of self–aligned InGaAs quantum dots on GaAs multiatomic steps by metalorganic chemical vapor deposition", pp. 3663–3665. Applied Physic Letter 66 (26) Jun. 95.

Zh. I. Alferov et al., "An injection heterojunction laser based on arrays of vertically coupled InAs quantum dots in a GaAs matrix", pp. 194–196. Semiconductors 30(2) Feb. 96.

Primary Examiner—Charles Bowers
Assistant Examiner—Keith Christianson
Attorney, Agent, or Firm—Cohen, Pontani, Lieberman & Pavane

[57] ABSTRACT

The formation of self-assembled GaAs quantum dots on (100) GaAs via chemical beam epitaxy (CBE) technique using triethylgallium (TEGa) and arsine ($AsH_3$) is disclosed. GaAs quantum dots are easy to grow from Ga-droplets which are successively supplied with arsine with neither pattern definition nor pre-treatment steps prior to the growth. The density and the size of Ga-droplets are found to be sensitive to the growth conditions, such as the growth temperature, the beam equivalent pressure of TEGa, and the amount of TEGa supplied. This invention suggests that, unlike Stranski-Krastanow growth, the Ga-droplet-induced CBE technique can be a useful method for the fabrication of quantum dot structure by simple change of gas supply mode, even in lattice-matched system.

10 Claims, 7 Drawing Sheets

FIG. 7

GROWING METHOD OF GAAS QUANTUM DOTS USING CHEMICAL BEAM EPITAXY

BACKGROUND OF THE INVENTION

1. Field of the Invention

The present invention relates to a growing method of low-dimensional quantum structures, and more specifically to a method for growing high quality GaAs quantum dots by using a chemical beam epitaxy (CBE).

2. Description of the Prior Art

Ever since the advantages of zero-and one-dimensional semiconductor heterostructures were predicted the formation of high-quality quantum wires (QWRs) and quantum dots (QDs) has been of much interest. The formation of quantum dots has attracted particular attention due to three-dimensional quantum confinement effect, that can potentially lead to the understanding of new physics and opto-electronic device applications.

For this purpose, various approaches have been proposed and, of these, the preferred one was nanolithography. In this method, a pattern is first defined by high-resolution lithography and is subsequently transferred to a semiconductor quantum well substrate by dry chemical etching and/or impurity disordering using an ion beam implantation. These methods, however, have suffered some drawbacks, such as limited resolution and defects created by etching.

In order to decrease the damage level and the contamination, Stranski Krastanow (S-K) growing method has been disclosed. The S-K growth has advantages over the nanolithography method, because it has low damage level and contamination, and the density of nanostructure is not restricted by the resolution of the lithography processes. Until now, quantum dot structures have been mostly grown by using Stranski Krastanow mechanism.

However, this S-K growth has several disadvantages, such as limitation of material systems and generation of defects. In addition, this method is not used in lattice-matched material systems.

SUMMARY OF THE INVENTION

It is, therefore, desirable to be able to fabricate high quality GaAs quantum dots using easy and simple processes with neither sophisticated pattern definition nor pre-treatment steps prior to the growth.

An object of the present invention is to provide a very effective method to grow high-quality GaAs quantum dots using a Ga-droplet-induced chemical beam epitaxy by simple change of source supply mode, even in lattice-matched material systems.

In accordance with the present invention, there is provided a method for growing GaAs quantum dots, comprising the steps of:

(a) preparing a compound semiconductor substrate for growth of epilayer in a modified chemical beam epitaxy (CBE) apparatus;

(b) forming Ga droplets by supplying a group III source materials onto the substrate under optimal growth conditions; and (c) subsequent supplying a thermally pre-cracked arsine as group V source materials, after stopping the group III source material supply.

Preferably, the group III source material uses a triethylgallium (TEGa).

For improving the density and the size distribution of the Ga-droplets, the optimal growing condition is as follows:

(i) an exposure time of the TEGa is in the range of 20 to 30 seconds;

(ii) a beam equivalent pressure of the TEGa is in the range of $1\times10^{-4}$ to $5\times10^{-4}$ Torr; and (iii) a growing temperature of the substrate is in the range of 450 to 470° C.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENT

Hereinafter, the preferred embodiment of the present invention will be described in detail referring to the attached drawings.

Figure 1:
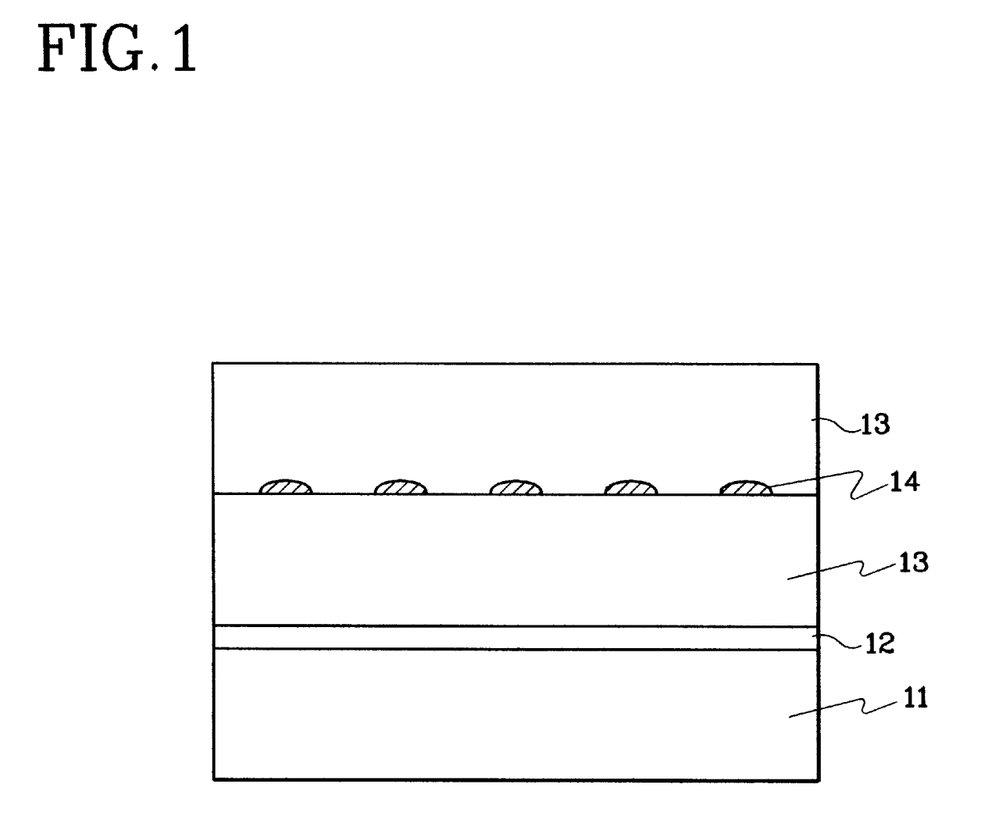
FIG. 1 shows a cross-sectional view of a heterojunction structure manufactured in accordance with the present invention.

Referring to FIG. 1, there is shown a heterojunction structure manufactured in accordance with the present invention.

Samples were grown in a modified CBE apparatus which consists of an ultrahigh vacuum growth chamber and a gas source control system. Cr-doped GaAs (100) substrate 11 were used. Prior to the growth, the GaAs substrate 11 was heated to remove adsorbed impurity and surface oxide layers. And then, a GaAs buffer layer 12 and a AlGaAs barrier 13 are sequentially grown on the GaAs substrate 11.

For forming Ga-droplets, the subsequent supply of Group Ill or V sources were performed at growth temperatures between 420 to 550° C.

The growth sequence of Ga-droplets is as follows. After the temperature of the GaAs substrate 11 reached the growth temperature, TEGa (triethylgallium) was supplied onto the sample, where the Ga-droplets were formed. Then, arsine ($AsH_3$) was supplied again a few seconds later after stopping the TEGa supply. Then, the substrate temperature was decreased under arsine supply. As a result, GaAs quantum dots 14 are formed.

For successfully growing high-quality GaAs quantum dots by Ga-droplet-induced CBE using TEGa and thermally cracked arsine, the formation of Ga-droplets, whose characteristics depend not only on the growth parameters but also on the misorientation angle of substrates, is required to be optimized under various growth conditions.

Figure 2:
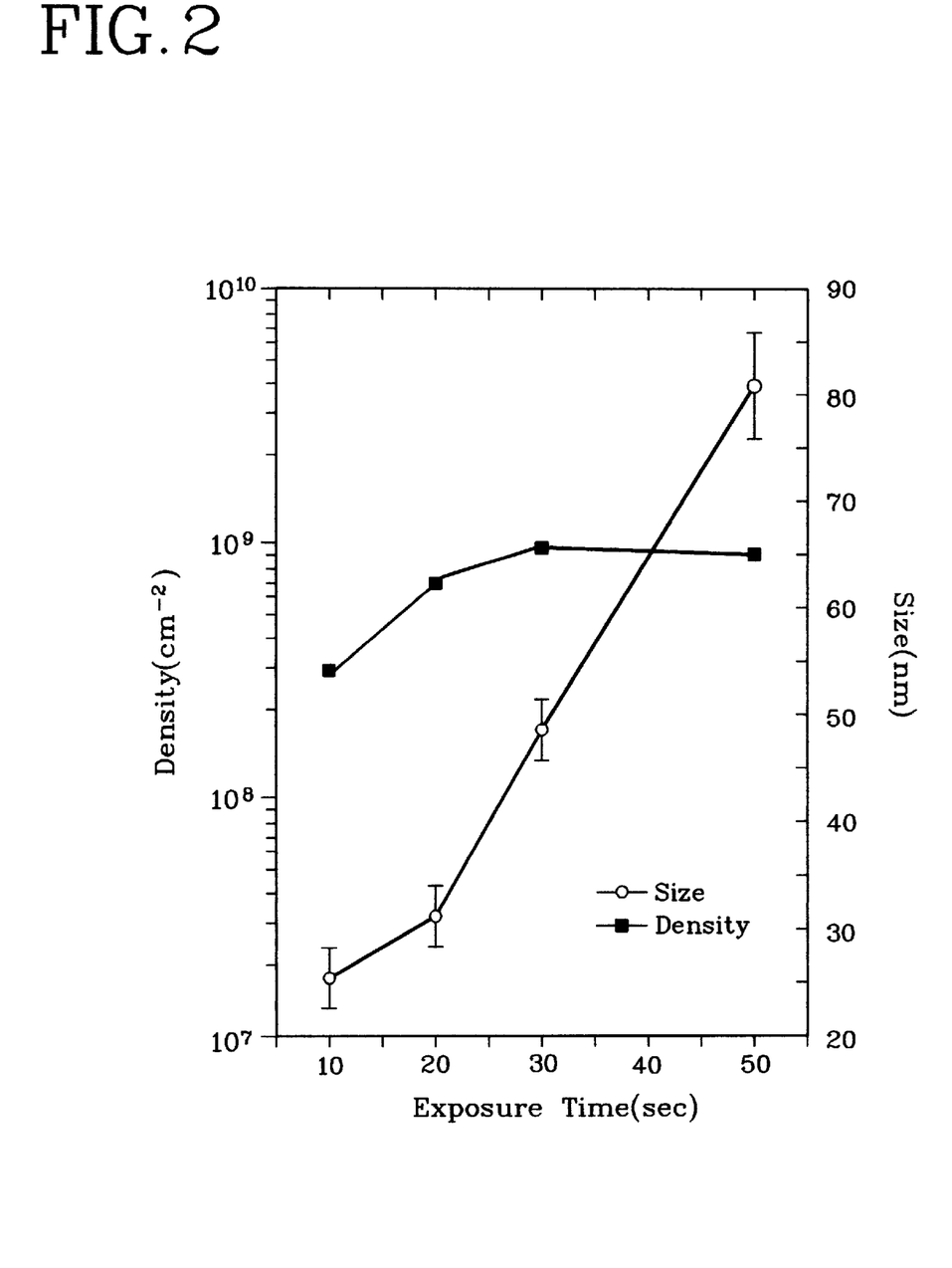
FIG. 2 is a graph illustrating dependence of the average diameter and the density of Ga-droplets on the supplied amount of TEGa.

FIG. 2 shows the dependence of the average diameter and the density of Ga-droplets on the amount of TEGa supplied at the growth temperature of 470° C. under a beam equivalent pressure of $2 \times 10^5$ Torr. The density and size distribution was obtained by using high-resolution scanning electron microscope (HRSEM). In the initial stage, the size and the density of Ga-droplets increased with the increase in the amount of TEGa supplied. The change of density of Ga-droplets was negligible after 20 seconds exposure of TEGa, but the size of Ga-droplets monotonically increased with the increase of exposure time of TEGa. The standard deviation of the size distribution of the Ga-droplet is about 10% in all samples observed.

Therefore, after the nucleation of the supersaturated Ga-adspecies once occurs on the surface, the major process is the growth of Ga-droplets with the increase in the amount of TEGa supplied. Since the distance between droplets is small compared to the diffusion length of Ga-adspecies, all the Ga-adspecies decomposed between the droplets are captured by the neighbor droplets after a certain amount of TEGa is supplied. Consequently, the size of Ga-droplets increase depending on the amount of TEGa supplied without variation of droplet density. As shown in FIG. 2, it can be seen that an optimal exposure time of TEGa is a range of about 20–30 seconds.

Figure 3:
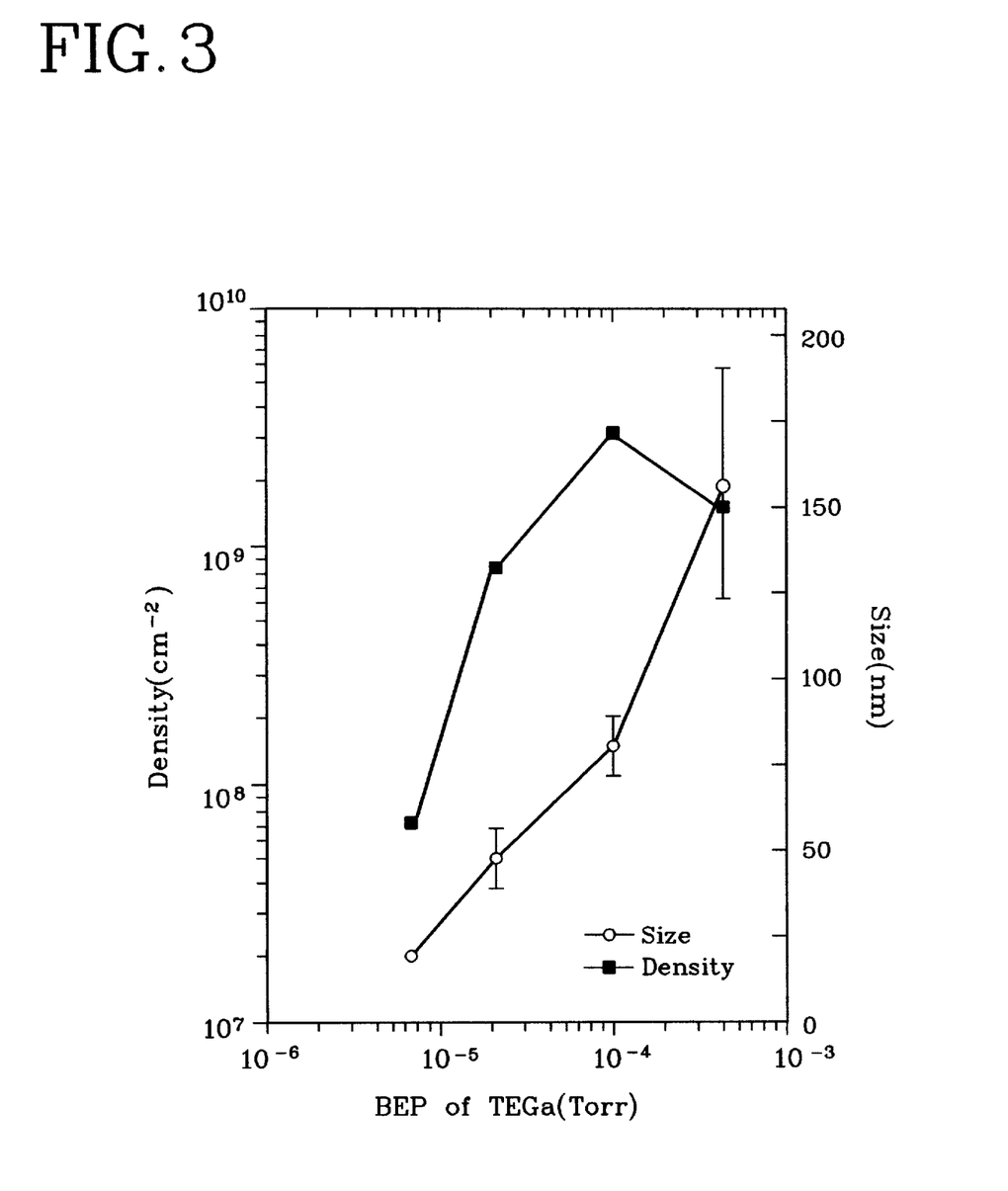
FIG. 3 is a graph illustrating effect of a beam equivalent pressure (BEP) of TEGa on the density and average diameter of Ga-droplets.

FIG. 3 shows the effect of the BEP of TEGa on the density and average diameter of Ga-droplets formed on the surface during the Ga-droplet formation process. The samples were grown at a growth temperature of 470° C. with the same TEGa exposure time (30 sec.).

In the low BEP region of $3 \times 10^{-6}$ Torr, the formation of Ga-droplets was not observed on the sample surface. Beyond the low BEP region, the density of Ga-droplets increased by increasing the BEP of TEGa supplied and then decreased in the high BEP regions. The increase of Ga-droplet density can be understood by considering the classical nucleation theory at solid vapor interface. However, the density of Ga-droplets started to decrease beyond the BEP of $1.0 \times 10^4$ Torr. In this higher BEP region, a rapid increase of droplet size and broadening of the size distribution of Ga-droplets were observed. The decrease of density is attributable to the coalescence of droplets with the increase of the growth of Ga-droplets. Therefore, the optimized growth condition of BEP is in the range of $1 \times 10^{-4} \sim 5 \times 10^{-5}$ Torr as shown in FIG. 3.

Figure 4:
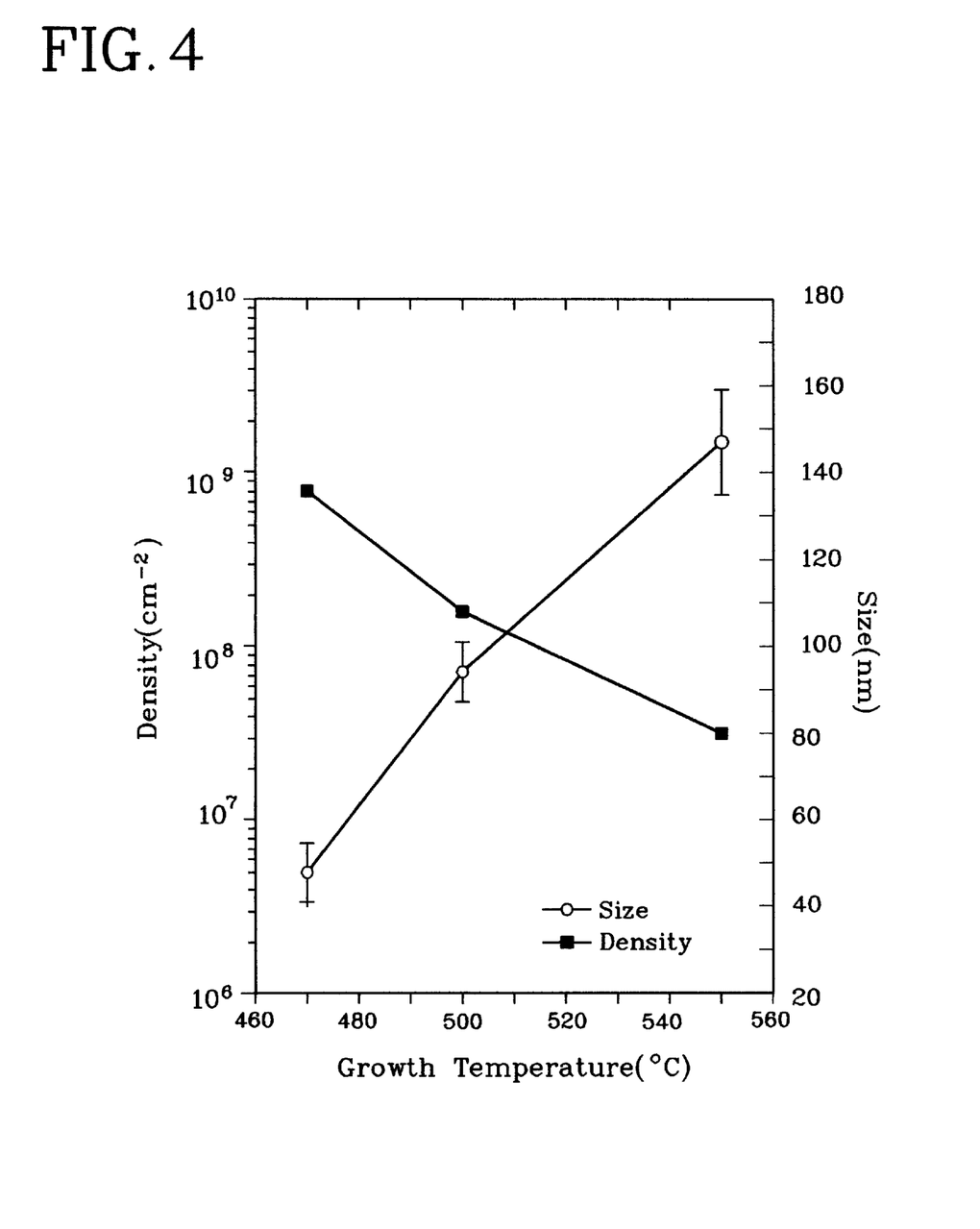
FIG. 4 is a graph showing dependence of the density and the average size of Ga-droplets as a function of growth temperature.

FIG. 4 shows the dependence of density and size of Ga-droplets as a function of growth temperature from 420 to 550° C. at the BEP of $2 \times 10^{-5}$ Torr. At the growth temperature of 420° C., no indication of Ga-droplet formation on the grown surface was observed using HRSEM. This may be due to the limitation of TEGa decomposition at the low growth temperature. At low growth temperature, the supersaturated Ga-adspecies were not efficiently formed on the surface for the nucleation of Ga-droplets. Above this growth temperature, the density of Ga-droplets decreased with increasing growth temperature of up to 550° C. The fact that the decrease of density of Ga-droplets depends on the growth temperature is consistent with the temperature dependence of classical nucleation theory. As the temperature increases, the activation energy of nucleation process increases dramatically and the nucleation rate of drops. These facts imply that the nucleation rate of supersaturated Ga-adspecies drops rapidly resulting in the decrease of density with the growth temperatures. Also, the increase of Ga-droplets size was observed with increasing growth temperature, as shown in FIG. 4. This results from the increase of migration length of Ga-adspecies on the surface with the increase of substrate temperature. Therefore, the growth of Ga-droplets was effectively enhanced depending on the increase of growth temperature. Preferably, in the preferred embodiments, optimal temperature of the substrate is about 450 to 470° C.

Figure 5:
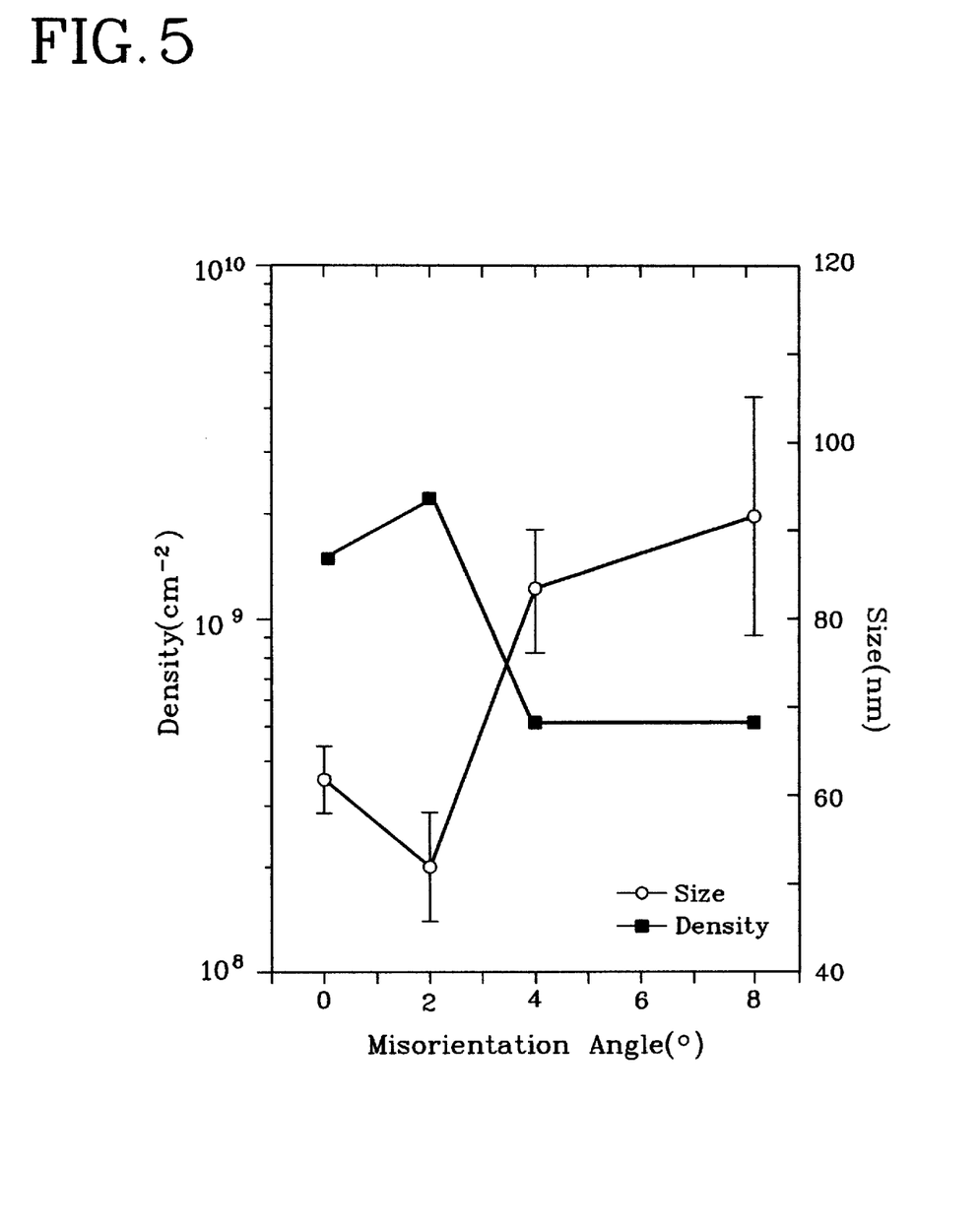
FIG. 5 is a graph showing effect of misorientation angle of GaAs substrate on the density and the average size of Ga-droplets.

FIG. 5 shows the effect of misorientation angle of GaAs substrate on the density and the size of Ga-droplets at the growth temperature of 470° C. The creation of the Ga-droplets was performed on (100) GaAs substrates with 0°, 2°, 4°, and 8° off toward [110] at the BEP of TEGa of $2.0 \times 10^{-5}$ Torr. Growth on an exact and on a slightly misoriented surface (2° off toward [110]) showed similar features regarding both the density and size of created Ga-droplets. The density of droplets was nearly the same as that on an exactly oriented GaAs surface. The size of Ga-droplets increased with decreasing density of Ga-droplets on the highly misoriented substrates. This tendency is attributed to the fact that the size of Ga-droplet is inversely proportional to the density under the same amount of TEGa supplied.

Figure 6:
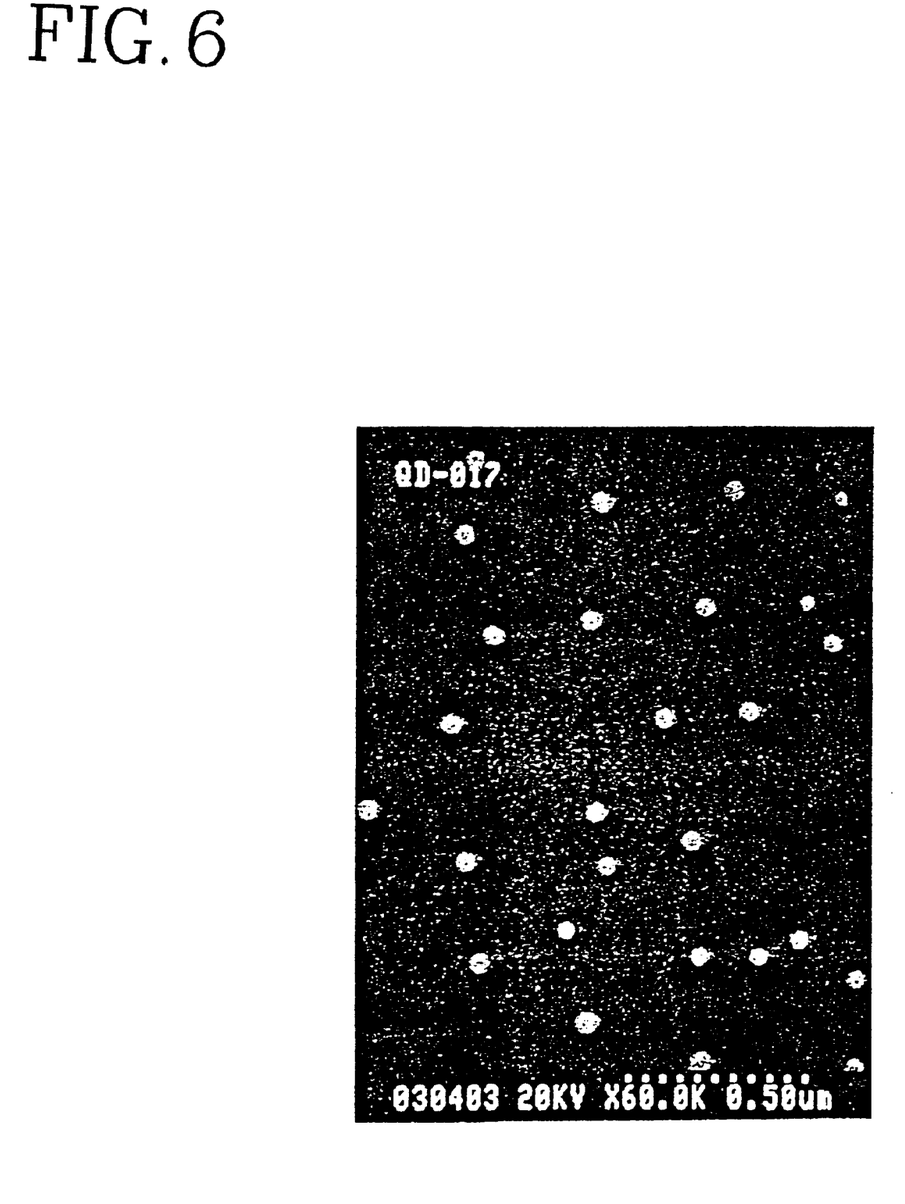
FIG. 6 shows an SEM (Scanning Electron Microscopy) micrograph of Ga-droplets formed on GaAs substrate according to the present invention.

FIG. 6 shows a SEM micrograph of Ga-droplets formed by the supply of TEGa corresponding to about six monolayers at a substrate temperature of 470° C. The Ga droplets show a round shape with diameter of about 50 nanometers, height of about 20 nanometers, and density of $1 \times 10^9$ cm$-2$, and are formed without any process prior to the growth.

Figure 7:
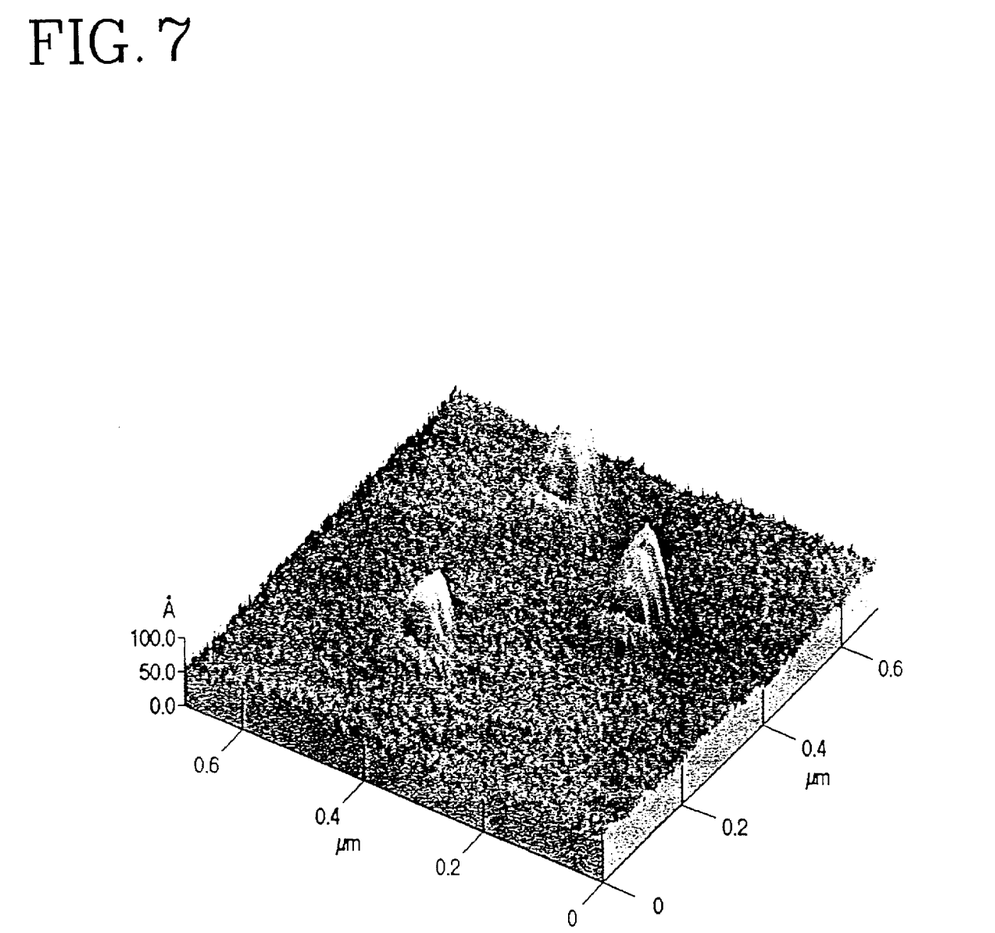
FIG. 7 shows an AFM (Automic Force Microscope) image of GaAs islands grown by this invention.

FIG. 7 shows the AFM image of GaAs islands grown by Ga-droplet formation and successive supply of arsine. The GaAs islands are observed in round shape each with a diameter of about 50nm and a height of about 10nm, and were formed without any process prior to the growth. It is confirmed the formation of GaAs islands from Ga-droplets using cross-sectional transmission electron microscopy (TEM) with atomic resolution. Well-defined zinc-blend structure of GaAs islands were coherently grown on the GaAs buffer layer. It is quite different from the conventional MBE (Molecular Beam Epitaxy). In MBE growth, Ga-droplets disappear after As molecular beam supply is directed to GaAs surface. Therefore, the droplet epitaxy technique of MBE is quite complicated and requires a number of steps to obtain an inert surface with appropriate dangling bonds suitable for supporting the adhesion of foreign atoms. In contrast, GaAs islands can be grown on bare GaAs surface by Ga-droplet-induced CBE without any pretreatment step. This phenomenon can be attributed to the passivation effect of the Ga-droplet by hydrogen and hydrocarbon radicals dissociated from arsine and TEGa during the Ga-droplet-induced CBE.

As described above, according to the present invention, high-quality GaAs quantum dots are easy to grow from Ga-droplets which are successively supplied with arsine with neither pattern definition nor pre-treatment steps prior to the growth. The growth of high-density GaAs quantum dots can be achieved by a simple change of source supply mode and their characteristics were found to depend not only on the growth conditions but also on the substrate misorientations.

Additionally, the present invention demonstrates that Ga-droplet-induced chemical beam epitaxy can be a very effective method to grow quantum dots, even in lattice-matched material systems unlike Stranski-Krastanow growth.

While the present invention has been described with respect to certain preferred embodiments only, other modifications and variations may be made without departing from the scope of the present invention as set forth in the following claims.

What is claimed is:

1. A method for growing GaAs quantum dots, using chemical beam epitaxy (CBE), comprising the steps of:
   (a) preparing a compound semiconductor substrate for growth of an epilayer in a modified chemical beam epitaxy (CBE) apparatus;
   (b) forming Ga droplets on the semiconductor substrate by exposing the substrate to a group III source material under optimal growth conditions; and
   (c) subsequent to completing step (b), supplying a group V source material.

2. The growing method of GaAs quantum dots according to claim 1, wherein said group III source material is triethylgallium (TEGa).

3. The growing method of GaAs quantum dots according to claim 1, wherein an exposure time of the TEGa under optimal growth conditions ranges from 20 to 30 seconds, to improve the density and the size distribution of the Ga-droplets.

4. The growing method of GaAs quantum dots according to claim 1, wherein a beam equivalent pressure of the TEGa is in the range of $1 \times 10^{-4}$ to $5 \times 10^{-4}$ Torr, to improve the density and the size distribution of the Ga-droplets.

5. The growing method of GaAs quantum dots according to claim 1, wherein a growing temperature of the substrate is in the range of 450° C. to 470° C., to improve the density and the size distribution of the Ga-droplets.

6. The method of claim 1, wherein the group V source material comprises a thermally pre-cracked arsine.

7. The method of claim 1, wherein optimal growth conditions further comprise:
   (1) exposing the semiconductor substrate to a Group III source material for an exposure time in the range of 20 to 30 seconds;
   (2) setting a beam equivalent pressure of the Group III source material in the range of $1 \times 10^{-4}$ to $5 \times 10^{-4}$; and
   (3) setting a growing temperature of the substrate in the range of 450° C. to 470° C.

8. The method of claim 2, wherein the Group III source material is triethygallium (TEGa).

9. The method according to claim 1, wherein step (a) further comprises:
   (1) pre-heating a GaAs substrate to remove adsorbed impurity and surface oxide layers; and
   (2) sequentially growing on the GaAs substrate a GaAs buffer layer and AlGaAs barrier layer.

10. The method of claim 1, further comprising the step of:
    (d) decreasing the substrate temperature using an Arsine supply.

* * * * *